United States Patent
Saga et al.

(10) Patent No.: US 7,670,496 B2
(45) Date of Patent: Mar. 2, 2010

(54) PROCESS FOR PRODUCING STRUCTURAL BODY AND ETCHANT FOR SILICON OXIDE FILM

(75) Inventors: Koichiro Saga, Kanagawa (JP); Hiroya Watanabe, Tokyo (JP); Tomoyuki Azuma, Tokyo (JP)

(73) Assignees: SONY Corporation, Tokyo (JP); Mitsubishiki Gas Chemical Company, Inc., Tokyo (JP)

( * ) Notice: Subject to any disclaimer, the term of this patent is extended or adjusted under 35 U.S.C. 154(b) by 549 days.

(21) Appl. No.: 11/011,111

(22) Filed: Dec. 15, 2004

(65) Prior Publication Data

US 2005/0205515 A1 Sep. 22, 2005

(30) Foreign Application Priority Data

Dec. 22, 2003 (JP) .............................. 2003-423966

(51) Int. Cl.
*H01L 21/302* (2006.01)
(52) U.S. Cl. .............................. 216/13; 216/15; 216/17; 216/58; 216/72; 216/79; 216/80; 438/689; 438/706
(58) Field of Classification Search ....................... None
See application file for complete search history.

(56) References Cited

U.S. PATENT DOCUMENTS

| | | | | |
|---|---|---|---|---|
| 5,105,556 A * | 4/1992 | Kurokawa et al. | ............ | 34/470 |
| 6,149,828 A * | 11/2000 | Vaartstra | ...................... | 216/57 |
| 6,426,239 B1 * | 7/2002 | Gogoi et al. | .................. | 438/53 |
| 6,576,066 B1 * | 6/2003 | Namatsu | ...................... | 134/30 |
| 6,576,489 B2 * | 6/2003 | Leung et al. | .................. | 438/52 |
| 6,641,678 B2 * | 11/2003 | DeYoung et al. | .............. | 134/36 |
| 6,666,986 B1 * | 12/2003 | Vaartstra | .................... | 252/79.1 |
| 6,848,458 B1 * | 2/2005 | Shrinivasan et al. | ......... | 134/108 |
| 6,924,222 B2 * | 8/2005 | Goodner et al. | ............. | 438/622 |

(Continued)

FOREIGN PATENT DOCUMENTS

JP 09-090353 4/1997

(Continued)

OTHER PUBLICATIONS

European Search Report, for Application No. 041064502-2203 PCT, dated Oct. 31, 2005.

(Continued)

*Primary Examiner*—Anita K Alanko
(74) *Attorney, Agent, or Firm*—Antonelli, Terry, Stout & Kraus, LLP.

(57) ABSTRACT

A structural body comprising a substrate and a structural layer formed on the substrate through an air gap in which the structural layer functions as a micro movable element is produced by a process comprising a film-deposition step of successively forming a sacrificial layer made of a silicon oxide film and the structural layer on the substrate, an air gap-forming step of removing the sacrificial layer by etching with a treating fluid to form the air gap between the substrate and the structural layer, and a cleaning step. By using a supercritical carbon dioxide fluid containing a fluorine compound, a water-soluble organic solvent and water as the treating fluid, the sacrificial layer is removed in a short period of time with a small amount of the treating fluid without any damage to the structural body.

13 Claims, 7 Drawing Sheets

U.S. PATENT DOCUMENTS

| | | | |
|---|---|---|---|
| 6,930,034 B2 * | 8/2005 | Colburn et al. | 438/619 |
| 6,951,769 B2 * | 10/2005 | Malone | 438/51 |
| 7,045,459 B2 * | 5/2006 | Freidhoff | 438/666 |
| 7,119,052 B2 * | 10/2006 | Korzenski et al. | 510/175 |
| 7,160,815 B2 * | 1/2007 | Korzenski et al. | 438/753 |
| 2002/0013239 A1 | 1/2002 | Sahbari | |
| 2002/0127844 A1 * | 9/2002 | Grill et al. | 438/622 |
| 2003/0047533 A1 * | 3/2003 | Reid et al. | 216/24 |
| 2003/0202792 A1 | 10/2003 | Goshi | |
| 2004/0259357 A1 | 12/2004 | Saga | |
| 2007/0111533 A1 * | 5/2007 | Korzenski et al. | 438/745 |
| 2009/0178999 A1 * | 7/2009 | Jousseaume et al. | 216/13 |

FOREIGN PATENT DOCUMENTS

| | | |
|---|---|---|
| JP | 2003-249475 | 9/2003 |
| WO | WO 01/33613 | 5/2001 |

OTHER PUBLICATIONS

J. H. Lee, et al., "Characterization of anhydrous HF gas-phase etching with $CH_3OH$ for sacrificial oxide removal", *Sensors and Actuators A*, vol. 64, pp. 27-32, 1998.

Singapore Office Action dated Nov. 29, 2006, for Singapore Application No. 200407546-1.

* cited by examiner

PROCESS FOR PRODUCING STRUCTURAL BODY AND ETCHANT FOR SILICON OXIDE FILM

BACKGROUND OF THE INVENTION

1. Field of the Invention

The present invention relates to a process for producing a structural body and an etchant for silicon oxide film, and more particularly relates to a process for producing a structural body in which fine dust particles adhering to micro structural body are removed without damaging a movable element by removing a sacrificial layer made of a silicon oxide film to form an air gap and cleaning with a specific treating fluid. The process is suitable for producing a micro structural body such as micro electromechanical systems (MEMS) and semiconductor pressure sensors. The invention further relates to an etchant for silicon oxide film for use in the production of the structural body.

2. Description of the Prior Art

Recently, there have been proposed integrated semiconductor measuring devices which are manufactured, utilizing a surface-micromachining techniques, by forming sensors such as a minute pressure sensors and accelerator sensors on a silicon semiconductor substrate and mounting a circuit for processing operating signals thereof on the same silicon semiconductor substrate.

These sensors have a movable diaphragm or beam structural body, and signals are generated by the movement of the diaphragm or beam structural body. The movable diaphragm or beam structural body constituting the sensor is produced by first forming a sacrificial film and then forming a structural film as a movable element on the sacrificial film, and then removing the sacrificial film to form a diaphragm or beam structural body made of the structural film.

The production of semiconductor devices such as transistor as one of micro structural bodies generally includes a cleaning treatment with a cleaning liquid and a drying treatment to remove residual fine particles or etching residues before a process for forming a film such as a semiconductor film or after a process for etching treatment or polishing treatment. Since most of these micro structural bodies are mechanically weak, the etching of the sacrificial layer and the cleaning must be carried out with great care to avoid the damage to the micro structural body.

The micro structural body which is subjected to etching for removing the sacrificial layer and cleaning during its production, or the micro structural body to be cleaned is roughly classified into a micro structural body having a movable element and a micro structural body having no movable element. The micro structural body having a movable element is provided with a movable element supported on a stationary substrate through a narrow space, and exemplified by a micro driving body called MEMS used as parts for various sensors. The micro structural body having no movable element has a microstructure with a large aspect ratio (height/width of an opening) and is exemplified by a semiconductor substrate a fine LSI pattern and a photomask for forming fine patterns.

Construction and Production of Micro Structural Body Having Movable Element

The micro structural body having a movable element such as MEMS has been increasingly required to be made into still finer with expansion of their applications to various parts such as sensors.

The construction of the micro structural body having a movable element such as MEMS is explained by referring to FIG. 2 in which FIG. 2a is a perspective view showing the construction of a diaphragm structural body and FIG. 2b is a cross-sectional view taken along the line I-I of FIG. 2a. As shown in FIG. 2, the diaphragm structural body 40 is a pressure sensor having a diaphragm structure supported at its four sides, and includes a monocrystalline silicon substrate 42 and a diaphragm structure (bridge structure) 46 formed on the substrate 42 through an air gap 44. The diaphragm structure (bridge structure) 46 is a laminated film comprising a silicon nitride film 48 functioning as a structural film, a polycrystalline silicon film 50 functioning as a strain gauge, and a silicon nitride film 52 functioning as a protective film. When a voltage is applied between a substrate-side electrode (not shown) formed on the substrate 42 and a drive-side electrode 54 connected to the strain gauge film 50, the diaphragm structure (bridge structure) 46 functions as a movable element by moving close to or apart from the substrate 42 by an electrostatic attraction force or an electrostatic repulsion force.

Next, the process for producing the diaphragm structural body 40 is explained by referring to FIGS. 3 and 4 in which FIGS. 3a through 3d and FIGS. 4e and 4f are cross-sectional views of the intermediate products and the diaphragm structural body 40 in each production step, taken along the line I-I shown in FIG. 2a.

As shown in FIG. 3a, a silicon oxide film 56 as a sacrificial layer is first formed on the substrate 42. Then, as shown in FIG. 3b, the silicon oxide film 56 is patterned into a desired shape. As shown in FIG. 3c, the silicon nitride film 48, the polycrystalline silicon film 50 and the silicon nitride film 52 are sequentially formed over an entire surface of the substrate 42. Then, as shown in FIG. 3d, the silicon nitride film 48, the polycrystalline silicon film 50 and the silicon nitride film 52 are etched by a reactive ion etching method to form a laminate of the silicon nitride film 48, the polycrystalline silicon film 50 and the silicon nitride film 52 having a desired shape. Then, as shown in FIG. 4e, the drive-side electrode 54 electrically connected to the polycrystalline silicon film 50 is formed. Next, as shown in FIG. 4f, the sacrificial layer made of the silicon oxide film 56 is removed by a selective etching to make the laminate formed on the sacrificial layer into the diaphragm structure 46 that is supported on the substrate 42 through the air gap 44.

Next, an example of the construction of the beam structural body is explained by referring to FIG. 5 in which FIG. 5a is a perspective view showing the construction of the beam structural body and FIG. 5b is a cross-sectional view taken along the line II-II of FIG. 5a.

The beam structural body 60 shown in FIG. 5 is an acoustic resonator having a double-suspended beam member, which includes a monocrystalline silicon substrate 62 and a beam structure (bridge structure) 66 formed over the monocrystalline silicon substrate 62 through an air gap 64. The beam structure (bridge structure) 66 is made of a polycrystalline silicon film 68 serving as a strain gauge, i.e., a piezoelectric layer, and supported on the substrate 62 through the air gap 64.

When a voltage is applied between a substrate-side electrode 69 provided on the substrate 62 and a drive-side electrode 70 bonded to the polycrystalline silicon film 68, the beam structure 66 functions as a movable element by moving close to or apart from the substrate 62 by an electrostatic attraction force or an electrostatic repulsion force. The beam structure 66 may be either a double-suspended type or a single-supported type (cantilever type).

The MEMS having such a movable beam structural member have come to be widely used as contactors of sensors, oscillators, micro springs, optical elements, etc.

Next, the process for producing the beam structural body 60 is explained by referring to FIG. 6 in which FIGS. 6a through 6d are cross-sectional views of the intermediate products and the beam structural body in each production step, taken along the line II-II of FIG. 5a.

As shown in FIG. 6a, a silicon oxide film 72 as a sacrificial layer is first formed on the substrate 62 and patterned to form the structures 62 shown in FIG. 5. Then, as shown in FIG. 6b, the polycrystalline silicon film 68 as a piezoelectric film is formed so as to cover the entire surface of the silicon oxide film 72. Next, the polycrystalline silicon film 68 is dry-etched and patterned into a shape of the beam structure (not shown), and then an electrode 74 is formed on the polycrystalline silicon film 68 as shown in FIG. 6c. Then, as shown in FIG. 6d, the sacrificial layer made of the silicon oxide film 72 is removed by etching. As a result, the polycrystalline silicon film 68 formed on the sacrificial layer is made into the beam structure 66 that is supported in the form of bridge over the substrate 62 through the air gap 64.

In the production of the diaphragm structural body 40, the laminate of the silicon nitride film 48, the polycrystalline silicon film 50 and the silicon nitride film 52 is patterned and then the sacrificial layer made of the silicon oxide film 56 is removed by etching. During the etching treatment, the etching gas is reacted with the material of the layer being etched to produce a reaction product that adheres to the diaphragm structure 46 as residual fine particles as shown in FIG. 7a, thereby making the production of a sensor having a desired performance difficult. Therefore, it is necessary to clean and remove the residual fine particles with a cleaning liquid.

For example, if the sacrificial layer of the silicon oxide film 56 is removed by an etching treatment with a wet etchant generally used in the production of semiconductor devices such as a hydrogen fluoride solution and a subsequent drying treatment, the diaphragm structure 46 constituted of the laminate of the silicon nitride film 48, the polycrystalline silicon film 50 and the silicon nitride film 52 which is supported on the substrate 42 through the air gap 44 tends to be damaged or stuck on the substrate 42.

The damage to the diaphragm structure 46 and its firm attachment to the substrate 42 are attributable to a suction force sucking the diaphragm structure 46 into the substrate 42 which is generated as follows. In the course of evaporation of the cleaning liquid or the rinsing liquid during the drying treatment, the liquid remaining in a very small space (air gap 44) between the diaphragm structure 46 and the substrate 42 is evaporated to reduce its volume. The reduction of volume causes the suction force between the diaphragm structure 46 and the substrate 42 by a surface tension of the liquid. If the diaphragm structure 46 is insufficient in rigidity, the diaphragm structure 46 is stuck on the substrate 42 or fractured. In addition, since the diaphragm structure 46 formed on the substrate 42 is fine and mechanically weak, it may be broken by hydraulic pressure produced by stirring of the cleaning liquid or rinsing liquid during the cleaning or rinsing step.

Similarly, in the production of the beam structural body 60, if the removal of the sacrificial layer made of the silicon oxide film 72 is conducted by an etching treatment with a wet etchant such as a hydrogen fluoride solution and a subsequent drying treatment, the beam structure 66 made of the polycrystalline silicon film 68 held over the substrate 62 through the air gap 64 tends to be damaged or stuck on the substrate 62.

Cleaning of Micro Structural Body Having No Movable Element (1) Electron Beam Exposure Mask Before describing the cleaning of an electron beam exposure mask, the cleaning of a resist mask or a pattern formed by using a resist mask generally employed in the patterning of semiconductor devices is described as an example of the cleaning of the micro structural body having no movable element.

In the pattern formation on a substrate employed in the production of semiconductor devices, a resist film is first formed on a patterning layer of the substrate and subjected to photo-lithographic treatment to produce a resist mask. Then, after the patterning layer is etched through the resist mask, the resist mask is removed by ashing, etc. Thereafter, the etching residues are removed by a cleaning treatment using a cleaning liquid and a rinsing treatment using pure water. Then followed by a drying treatment, the pattern is formed. Also, in the formation of the resist mask, after developed by the photo-lithographic treatment, the resist mask is cleaned with a rinsing liquid and then dried.

With the recent tendency toward increase in scale and large integration of semiconductor devices such as MOS-LSI, the LSI patterns become much finer and patterns having a line width of about 100 nm are now required. Upon forming such patterns having a line width of about 100 nm, the resist mask inevitably has an increased aspect ratio. In other words, the aspect ratio of an opening pattern for the micro structural body having no movable element becomes more and more large. The opening pattern with such a large aspect ratio causes the pattern fall as described later during a cleaning treatment, although its degree varies.

In the patterning of a line width of 100 nm or less, although the line width reaches less than the wavelength of a laser used in photolithography, the patterning by the photo-lithography is managed to be employed by suitably varying the exposure methods or masks, for example, by the use of half tone phase-shift mask. However, the patterning by the photo-lithography reaches almost its limit. Therefore, the lithography utilizing electron beam exposure has now been studied for its practical use in the patterning of semiconductor devices with a line width of 70 nm or less.

As shown in FIG. 7b, unlike the optical exposure masks, an electron beam exposure mask 80 is supported by a supporting frame 82 and constituted of a membrane 86 having opening patterns 84. The opening patterns 84 with large aspect ratios (height/width) extending through the membrane 86 are formed according to the designed circuit patterns. The electron beam reaches the resist film on a wafer through the opening pattern 84 for exposure.

When the patterns are formed through the electron beam exposure mask 80 by a reactive ion etching method, fine dust particles are attached and remain on the front and rear surfaces of the mask 80 as well as on the side wall of the opening pattern 84. Further, the fine dust particles tend to be frequently attached onto the mask during its use in the steps of transporting the mask to an exposure apparatus, fitting the mask to the exposure apparatus or exposing the mask to the electron beam. If the fine dust particles remain on the electron beam exposure mask 80 during the exposure, the fine dust particles are also imaged as a part of the pattern, resulting in the failure to obtain a pattern with a high accuracy. Therefore, the fine dust particles should be removed by cleaning with a cleaning liquid.

(2) Formation of Trench and Via for Wiring on Low-Dielectric Constant Film

To obtain a high-speed LSI, it has been inevitably required to reduce the capacity between wirings. Therefore, a low-dielectric constant (Low-k) film has come to be used as a layer insulation film between the wirings. Further, to produce an insulation film having a still lower dielectric constant, the insulation film must be made of a material having a lower-dielectric constant, and further the insulation film must have a porous structure.

In a Damascene process used for forming Cu-embedded wirings, as shown in FIG. 7(c), an etching stopper film 92 on an undercoat film 90 and a porous low-dielectric constant film 94 are etched to form a trench or via (via hole) for wiring 96 into which a wiring material, e.g., Cu is embedded and then polished to form a Cu-embedded wiring (not shown). After forming the trench or via for wiring 96 by etching the etching stopper film 92 and the porous low-dielectric constant film 94, as shown in FIG. 7(c), fine dust particles resulted from the reaction between the etching gas and the porous low-dielectric constant film 94 are attached onto the side walls of the trench or via for wiring 96 as well as the surface of the porous low-dielectric constant film 94. To produce embedded wirings successfully, the remaining fine dust particles should be removed with a cleaning liquid.

As described above, in the production of semiconductor devices, the fine dust particles should be removed with a cleaning liquid. However, the cleaning liquids include those suitable and unsuitable for removing the fine dust particles as described below.

Generally, water is widely used as the cleaning liquid for removing the fine dust particles by a wet cleaning. However, water fails to reach the bottom of the trench or via for wiring having a large aspect ratio because of its high surface tension. Even if reaching the bottom, it is difficult to remove the etching liquid remaining after the etching treatment from the trench or via for wiring, thereby failing to dry the trench or via.

Another significant problem caused upon drying the trench or via for wiring with fine patterns is a pattern fall. The pattern fall occurs upon drying the cleaning liquid or the rinsing liquid, and becomes more remarkable for patterns having a larger aspect ratio. The pattern fall is a phenomenon that a pattern is broken by a bending stress (surface tension or capillary force) which is generated during the drying after the cleaning by the pressure difference between the outside atmosphere and the cleaning or rinsing liquid remaining in patterns such as the trench or via for wiring. The capillary force varies depending on the surface tension of the cleaning or rinsing liquid which is generated at a vapor-liquid interface between the patterns and distorts the patterns formed. Therefore, the surface tension of the cleaning or rinsing liquid is an important factor for selecting a suitable cleaning or rinsing liquid.

In the wet cleaning of the porous low-dielectric constant film, the pores tend to be collapsed by the pressure difference due to the formation of a vapor-liquid interface during the cleaning liquid such as water goes in or out of the pores, posing a problem of increasing the dielectric constant.

Drying by Supercritical Fluid

As described above, in both cases of manufacturing the micro structural body having a movable element (in particular, in the step of etching the sacrificial layer) and cleaning the micro structural body having no movable element, the degree of the surface tension of the cleaning liquid has a large influence on the occurrence of damage to the micro structural body.

It is expected that the damage by the surface tension may be prevented by performing the cleaning and drying by using a fluid having a surface tension lower than that of water (about 72 dyn/cm), for example, using methanol (about 23 dyn/cm). The attachment of the movable element onto the substrate and the fracture of the patterns can be prevented by the drying after replacing water with methanol as compared to the drying of water. However, since the surface tension of methanol is still higher, the problems of the fracture of patterns and the pattern fall cannot be effectively solved.

The problems such as pattern fall due to the surface tension can be solved by using a fluid having a surface tension of zero as the cleaning or rinsing liquid or by drying after replacing a common rinsing liquid with a fluid having a surface tension of zero. The fluid having a surface tension of zero is a fluid in a supercritical state, i.e., a supercritical fluid. The supercritical state is one of phases taken by a substance in a state above the temperature and pressure specific to the substance, i.e., the critical temperature and the critical pressure. A substance in its supercritical state has unique properties that the viscosity is considerably low and the diffusion coefficient is extremely large despite its dissolving power to other liquids and solids similar to that of the substance in its liquid state, namely, the supercritical fluid may be a liquid having properties of gas. The supercritical fluid does not form a vapor-liquid interface to show a surface tension of zero. Therefore, if the drying is conducted in the supercritical state showing no surface tension, the pattern fall can be completely prevented.

The supercritical fluid is rapidly gasified by reducing the pressure of surrounding atmosphere to the critical pressure or lower. Therefore, the drying of the supercritical fluid after the cleaning treatment can be done by gasifying it under reduced pressure after releasing the supercritical fluid. Thus, the drying after cleaning with the supercritical fluid is easily completed.

The cleaning using the supercritical fluid may be conducted as follows. After separating the movable element partially or entirely apart from the supporting substrate by etching, or after forming micro patterns having a large aspect ratio by etching, the resultant product as-etched or after cleaning with a cleaning liquid or replacing with another liquid is brought into contact with the supercritical fluid stored in a pressure container. By such a contact, the remaining etchant, cleaning liquid and another liquid are dissolved into the supercritical fluid and removed together with etching residues.

Successively, the supercritical fluid is gasified and discharged by reducing the inner pressure of the pressure container to the critical pressure or lower while maintaining the pressure container at the critical temperature or higher, and thereafter, the micro structural body was taken into the outside atmosphere. Since the surface tension of the supercritical fluid is extremely small, the stress due to the surface tension applied onto the micro structural body during the removal of the supercritical fluid from the surface of the micro structural body is negligibly small. Therefore, by the use of the supercritical fluid as the cleaning liquid, the cleaning liquid, etc. adhering to the micro structural body during the etching treatment may be effectively removed without causing the deformation of damage of the micro structural body.

There has been proposed a method of introducing a supercritical fluid into a reaction chamber while or after removing water present inside of the chamber to dry the material immersed in a liquid (JP 2000-91180 A, page 4). There have been also proposed a method and an apparatus in which a liquid attached to a micro structural body is removed by dissolving in a supercritical fluid in a pressure container, the supercritical fluid is gasified for removal by reducing the inner pressure of the container to the critical pressure or lower, and then the dried micro structural body is taken into the outside atmosphere (JP 9-139374 A, page 5).

In the production of the diaphragm structural body or beam structural body, to prevent the adhesion of the diaphragm or beam member to the substrate during the drying by evaporating the etchant or rinsing liquid after removing the sacrificial layer made of the silicon oxide film by wet-etching, the drying is made by a supercritical drying. In the supercritical drying, the etchant (aqueous solution) used for the wet-etching must be replaced by a supercritical carbon dioxide fluid without exposing the structural body to the surrounding atmosphere.

However, since the aqueous etchant is immiscible with the supercritical carbon dioxide fluid, a complicated treatment is required in which the etchant is first replaced by a third solvent such as alcohol and then the alcohol is replaced by the supercritical carbon dioxide fluid, or the etchant is first replaced by the third solvent and then the third solvent is replaced by the supercritical carbon dioxide fluid. Further, since the replacement with the third solvent should be conducted without exposing the material to be cleaned, i.e., the micro structural body to the surrounding atmosphere to avoid the generation of surface tension, the solvent is consumed unfavorably in a large amount.

In addition, since the electrodes for the diaphragm structural body or beam structural body are generally made of a conductive metal material such as aluminum and aluminum alloys, the electrodes are corroded upon the exposure to the liquid etchant for removal of the sacrificial layer despite the use of the supercritical fluid for drying.

In the cleaning for removing only fine particles from the micro structural body, since a vapor-liquid interface is formed during the immersion in an aqueous solution for wet cleaning, the adhesion of the diaphragm or beam member to the substrate occurs during the cleaning. To avoid this problem, it is required to immerse the micro structural body in the supercritical fluid to create the supercritical state, replace by an alcohol, and then replace by the aqueous solution for cleaning. In addition, since the etchant used for wet etching should be replaced by the supercritical carbon dioxide fluid for drying without exposing the micro structural body to the surrounding atmosphere, the solvent is consumed unfavorably in a large amount.

The supercritical carbon dioxide fluid has dissolving properties similar to those of non-polar organic solvents, and therefore, shows a dissolving selectivity when used alone. Namely, the supercritical carbon dioxide fluid is effective for removing low-molecular organic substances, fats, oils and waxes, but ineffective for removing fine dust particles made of mixed inorganic compounds, fibers or organic high-molecular compounds such as plastics. Therefore, the single use of the supercritical carbon dioxide fluid is unsatisfactory for removing the silicon oxide film as the sacrificial layer and etching the silicon oxide film necessary for the removal of the particles. Therefore, there has been made study on the etching of the silicon oxide film under a supercritical state by adding an additive effective for the etching of the sacrificial film and removal of particles, such as a fluorine compound capable of etching the silicon oxide film, into the supercritical carbon dioxide fluid.

For example, there have been proposed a method of removing a silicon oxide film simultaneously with the removal of contaminants by using a supercritical fluid containing a fluorine compound or the fluorine compound and an organic solvent as a dissolving aid for contaminants (JP 64-45125 A, JP 10-135170 A, JP 2003-513342 A, and JP 2003-224099 A), and a method of etching an interlayer film using a supercritical fluid containing a fluorine compound for forming a hollow wiring (JP 2002-231806 A). However, the chemical substances such as fluorine compounds capable of etching the silicon oxide film are generally soluble in solvents such as water, but hardly soluble in the supercritical carbon dioxide fluid and have a low etching rate. In particular, in the formation of a diaphragm member or a beam member of sensor parts, the silicon oxide film as a sacrificial layer having a thickness of several tens to several hundreds nanometers must be completely etched, and the single-wafer cleaning should be completed within several seconds to one minute. However, the proposed methods fail to obtain a practical etching rate for etching the silicon oxide film.

SUMMARY OF THE INVENTION

The present invention has been made in view of the above problems. An object of the present invention is to provide a process for producing a structural body having a good micro structural body, in which the removal of a sacrificial layer made of a silicon oxide film and the removal of fine particles attached to the micro structural body are completed within a short period of time with a small amount of a solvent without any damage to the structural body having the micro structural body while keeping the properties of film forming a part of the micro structural body and the initial properties of film structure obtained at its formation.

As a result of extensive research on the treatment using a supercritical carbon dioxide fluid in view of solving the above problems, the inventors have found that the etching rate of the silicon oxide film is drastically increased by the use of a treating solution prepared by adding a fluorine compound, a water-soluble organic solvent and water to a supercritical carbon dioxide fluid. The invention has been accomplished on the basis of this finding.

Thus, there are provided the following first to seventh inventions:

(1) a process for producing a structural body comprising a substrate and a structural layer formed on the substrate through an air gap which structural layer functions as a micro movable element, said process comprising:

a film-deposition step of successively forming a sacrificial layer made of a silicon oxide film and the structural layer on the substrate; and an air gap-forming step of removing the sacrificial layer by etching with a treating fluid to form the air gap between the substrate and the structural layer, followed by a cleaning treatment, wherein said treating fluid used in the air gap-forming step is a supercritical carbon dioxide fluid containing a fluorine compound, a water-soluble organic solvent and water;

(2) a process for producing a structural body comprising a substrate and a structural layer formed on the substrate through an air gap which structural layer functions as a micro movable element, said process comprising:

a film-deposition step of successively forming a sacrificial layer made of a silicon oxide film and the structural layer on the substrate to form a laminate; and a subsequent air gap-forming step comprising the steps of:

(a) feeding a first treating fluid prepared by adding a fluorine compound, a water-soluble organic solvent and water to a supercritical carbon dioxide fluid into a single-bath chamber of a treating apparatus containing the laminate, thereby etching the sacrificial layer of the laminate and cleaning the laminate;

(b) feeding a supercritical carbon dioxide fluid containing only a water-soluble organic solvent into the chamber as a second treating fluid, thereby rinsing the laminate while replacing the first treating fluid with the second treating fluid;

(c) feeding only a supercritical carbon dioxide fluid to the chamber as a third treating fluid, thereby rinsing the laminate while replacing the second treating fluid with the third treating fluid; and (d) drying the laminate by gasifying and removing the supercritical carbon dioxide fluid fed as the third treating fluid, said steps (a) to (d) being sequentially conducted in the chamber in this order;

(3) an etchant for silicon oxide film for use in the process (1) or (2) after added to a supercritical carbon dioxide fluid, which comprises a mixture of a fluorine compound, a water-soluble organic solvent and water;

(4) a process for producing a structural body having a micro structural body from which an etchable layer is removed, which comprises:

an etching step of removing the etchable layer from the micro structural body by etching; and a subsequent cleaning step of contacting the resultant micro structural body with a treating fluid for cleaning, wherein said treating fluid is a supercritical carbon dioxide fluid containing a fluorine compound, a water-soluble organic solvent and water;

(5) a process for producing a structural body having a micro structural body from which an etchable layer is removed, which comprises the steps of:

(e) removing the etchable layer from the micro structural body by etching;

(f) feeding a first treating fluid prepared by adding a fluorine compound, a water-soluble organic solvent and water to a supercritical carbon dioxide fluid into a single-bath chamber of a treating apparatus containing the micro structural body, thereby cleaning the micro structural body;

(g) feeding a supercritical carbon dioxide fluid containing only a water-soluble organic solvent into the chamber as a second treating fluid, thereby rinsing the micro structural body while replacing the first treating fluid with the second treating fluid;

(h) feeding only a supercritical carbon dioxide fluid to the chamber as-a third treating fluid, thereby rinsing the micro structural body while replacing the second treating fluid with the third treating fluid; and (i) drying the micro structural body by gasifying and removing the supercritical carbon dioxide fluid fed as the third treating fluid, said steps (e) to (i) being sequentially conducted within the chamber in this order;

(6) an etchant for silicon oxide film for use in the process (4) or (5) after added to a supercritical carbon dioxide fluid, which comprises a mixture of a fluorine compound, a water-soluble organic solvent and water; and (7) the etchant for silicon oxide film as described in (3) or (6) for use in etching the silicon oxide after added to the supercritical carbon dioxide fluid, which comprises a mixture of 0.5 to 10% by weight of the fluorine compound, 80 to 99% by weight of the water-soluble organic solvent and 0.5 to 10% by weight of water.

In the processes of the first and fourth inventions, since the supercritical carbon dioxide fluid containing the etchant comprising the fluorine compound, the water-soluble organic solvent and water is used as the treating fluid, the sacrificial layer made of the silicon oxide film, etc., is removed to form an air gap without any damage to the micro structural body such as the diaphragm or beam member due to a surface tension generated at a vapor-liquid interface. Therefore, a micro structural body such as a diaphragm member, a beam member and an electron beam exposure mask is produced in a short period of time with a small amount of a solvent while keeping the properties of films constituting a part of the micro structural body and the initial properties of film structure obtained at its formation. In addition, in the processes according to the second and fifth inventions, since the etching step is followed by the specific rinsing and drying steps, the structural body is cleaned without collapsing pores of the microstructure, e.g., a porous low-dielectric constant film. Therefore, in the processes according to the first, second, fourth and fifth inventions, the aimed structural body having a stationary part and a movable part or the structural body having no movable part is produced in a high yield by a simple, safe and inexpensive process.

Further, according to the third, sixth and seventh inventions, an etchant for the silicon oxide film for use in the production of the structural body having a movable part or the structural body having no movable part is provided, which is capable of etching in a short period of time with a small amount without any damage to the structural body.

BRIEF DESCRIPTION OF THE DRAWINGS

FIG. 2b is a cross-sectional view taken along the line I-I of FIG. 2a;

FIGS. 3a to 3d are cross-sectional views of the products in respective steps of the production of a diaphragm structural body, taken along the line I-I of FIG. 2a;

FIGS. 4e and 4f are cross-sectional views of the products in respective steps subsequent to the step of FIG. 3d, taken along the line I-I of FIG. 2a;

FIG. 5b is a cross-sectional view taken along the line II-II of FIG. 5a;

FIGS. 6a to 6d are cross-sectional views of the products in respective steps of the production of a beam structural body, taken along the line II-II of FIG. 5a.

DETAILED DESCRIPTION OF THE INVENTION

Figure 1:
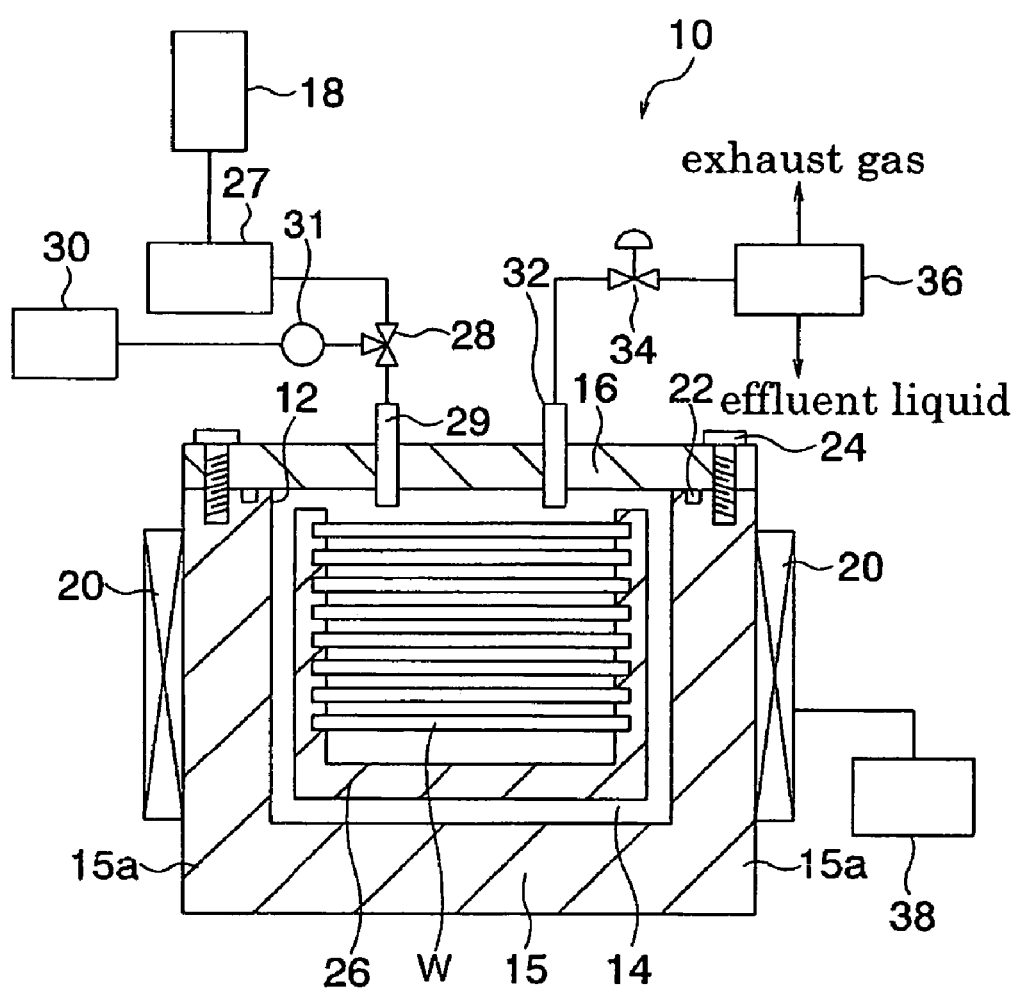
FIG. 1 is a flow sheet showing a construction of a treating apparatus used for carrying out the process described in example.

The process of the first invention is directed to a process for producing a structural body comprising a substrate and a structural layer formed on the substrate through an air gap which structural layer functions as a micro movable element, said process comprising:

a film-deposition step of successively forming a sacrificial layer made of a silicon oxide film and the structural layer on the substrate; and an air gap-forming step of removing the sacrificial layer by etching with a treating fluid to form the air gap between the substrate and the structural layer, followed by a cleaning treatment, wherein said treating fluid used in the air gap-forming step is a supercritical carbon dioxide fluid containing a fluorine compound, a water-soluble organic solvent and water. With this process, the silicon oxide film is removed without any damage to the structural body.

In the process of the first invention, the silicon oxide film for forming the sacrificial layer is preferably a thermal oxidation film, a native oxide film, a vacuum CVD oxide film and a plasma CVD oxide film each produced from tetraethoxysilane (TEOS) as the film-deposition raw material, a spin-on-glass (SOG) coating oxide film produced from an organosilicon oxide as the film-deposition raw material, or a spin-on-glass (SOG) coating oxide film produced from a film-deposition raw material other than the organosilicon oxide.

It has been known that various substances such as carbon dioxide, ammonia, water, alcohols, low-molecular aliphatic saturated hydrocarbons, benzene and diethyl ether can exist in the form of supercritical liquid. Of these substances, carbon dioxide having a supercritical temperature of 31.3° C. close to room temperature is particularly preferred because it can be easily handled and the structural body can be prevented from being exposed to high temperatures. Therefore, a supercritical carbon dioxide fluid is used in the invention.

The process of the first invention preferably includes, subsequent to the air gap-forming step, a first rinsing step of feeding a supercritical carbon dioxide fluid containing only a water-soluble organic solvent as a second treating fluid, a second rinsing step of feeding only the supercritical carbon dioxide fluid as a third treating fluid, and a drying step of drying the structural body by gasifying the supercritical carbon dioxide fluid fed as the third treating fluid. Namely, it is optimum in the process of the first invention to remove the silicon oxide film with the supercritical carbon dioxide fluid containing an etchant composed of the fluorine compound, the water-soluble organic solvent and water, then remove the fluorine compound by rinsing with the supercritical carbon dioxide fluid added with the water-soluble organic solvent, and finally dry the structural body by gasifying the supercritical carbon dioxide fluid.

In the process of the first invention, as the treating fluid, the supercritical carbon dioxide fluid containing the etchant for silicon oxide film comprising the fluorine compound, the water-soluble organic solvent and water is used. This treating fluid has been discovered as a result of careful and repeated experiments, and is especially effective for etching the sacrificial layer made of the silicon oxide film, etc. By mixing the fluorine compound generally known as an etching component for the silicon oxide film, the water-soluble organic solvent serving as a dissociation agent for the fluorine compound and water serving as an etching accelerator into the supercritical carbon dioxide fluid as the major ingredient, the effect of the fluorine compound for etching t the silicon oxide film is peculiarly improved to drastically increase the etching rate of the silicon oxide film. The fluorine compound, the water-soluble organic solvent and water may be separately added to the supercritical carbon dioxide fluid, or alternatively, may be added after formulated into an etchant for silicon oxide film comprising a mixture thereof.

In the process of the first invention, the etchant for silicon oxide film according to the third or seventh invention is preferably used. The mixing ratio of each ingredient of the etchant is 0.5 to 10% by weight for the fluorine compound, 80 to 99% by weight for the water-soluble organic solvent and 0.5 to 10% for water based on the total weight of these ingredients.

A content of the fluorine compound exceeding 10% by weight is not preferred because the treating fluid tends to be separated into two or more phases to result in the deposition of contaminants on the structural body or the rapture of its structure. The especially preferred fluorine compound is hydrogen fluoride.

If contained in an amount of 80 to 99% by weight, the water-soluble organic solvent exhibits the effect of promoting the etching of the silicon oxide film by the fluorine compound. By controlling the content of the fluorine compound within the above range, the etching rate of the silicon oxide film can be regulated within from 0.1 to 30 nm/min, thereby allowing the time-controlled accurate etching.

Water is added to promote the etching. If the water content is less than 0.5% by weight, the etching rate of the silicon oxide film tends to be lowered. If exceeding 10% by weight, the treating fluid tends to be separated into two or more phases, unfavorably resulting in the deposition of contaminants on the structural body and the rapture of its structure.

As the water-soluble organic solvent, preferred is at least one compound selected from the group consisting of alcohols, glycols, glycol ethers, γ-butyrolactone, or at least one compounds selected from the group consisting of esters, ethers, ketones, acetonitrile and sulfolane. When the water-soluble organic solvent is selected from alcohols, glycols, glycol ethers and γ-butyrolactone, the total addition amount thereof is preferably 1 to 10% by volume on the basis of the total volume of the supercritical carbon dioxide fluid containing the fluorine compound, the water-soluble organic solvent and water. When the water-soluble organic solvent is selected from esters, ethers, ketones, acetonitrile and sulfolane, the total addition amount thereof is preferably 1 to 20% by volume on the basis of the total volume of the supercritical carbon dioxide fluid containing the fluorine compound, the water-soluble organic solvent and water, with 1 to 10% by volume being preferred to obtain an extremely high etching rate of the silicon oxide film.

Examples of the alcohols, glycols and glycol ethers include methanol, ethanol, 2-propanol, ethylene glycol, propylene glycol, trimethylene glycol, pentamethylene glycol, 1,3-butanediol, 2,3-butanediol, 1,4-butanediol, diethylene glycol, triethylene glycol, tetraethylene glycol, dipropylene glycol, glycerin, ethylene glycol monomethyl ether, ethylene glycol monoethyl ether, ethylene glycol isopropyl ether, ethylene glycol monobutyl ether, 2-(methoxymethoxy)ethanol, diethylene glycol monomethyl ether, diethylene glycol monoethyl ether, diethylene glycol monobutyl ether, propylene glycol monomethyl ether, propylene glycol monoethyl ether, dipropylene glycol monomethyl ether and dipropylene glycol monoethyl ether, with water-soluble alcohols such as methanol, ethanol and 2-propanol being preferred.

Examples of the esters, ethers and ketones include methyl lactate, ethyl lactate, methyl 2-hydroxyisobutyrate, ethyl 2-hydroxyisobutyrate, ethylene glycol monomethyl ether acetate, diethylene glycol monoethyl ether acetate, ethylene glycol dimethyl ether, diethylene glycol dimethyl ether, diethylene glycol diethyl ether, tetrahydrofuran, tetrahydropyran, 1,4-dioxane, tetrahydrofurfuryl alcohol, acetone, 2-butanone, 2,5-hexanedione, hydroxyacetone and diacetone alcohol, with methyl lactate and ethyl lactate being preferred.

The water-soluble organic solvents exemplified above may be used singly or in a mixture of two or more. In addition, the water-soluble organic solvent used in the air gap-forming step may be the same as or different from that contained in the supercritical carbon dioxide fluid for use in the rinsing step.

By optimizing the composition of the etchant, the amount of the etchant to be added to the supercritical carbon dioxide fluid, treating time, treating temperature, the flow rate of the etchant and pressure, the etching rate is suitably controlled so as to reduce the etching amount to a minimized extent enough to remove fine particles attached to the micro structural body.

The process of the second invention is directed to a process for producing a structural body comprising a substrate and a structural layer formed on the substrate through an air gap which structural layer functions as a micro movable element, said process comprising:

a film-deposition step of successively forming a sacrificial layer made of a silicon oxide film and the structural layer on the substrate to form a laminate; and a subsequent air gap-forming step comprising the steps of:

(a) feeding a first treating fluid prepared by adding a fluorine compound, a water-soluble organic solvent and water to a supercritical carbon dioxide fluid into a single-bath chamber of a treating apparatus containing the laminate, thereby etching the sacrificial layer of the laminate and cleaning the laminate;

(b) feeding a supercritical carbon dioxide fluid containing only a water-soluble organic solvent into the chamber as a second treating fluid, thereby rinsing the laminate while replacing the first treating fluid with the second treating fluid;

(c) feeding only a supercritical carbon dioxide fluid to the chamber as a third treating fluid, thereby rinsing the laminate while replacing the second treating fluid with the third treating fluid; and (d) drying the laminate by gasifying and removing the supercritical carbon dioxide fluid fed as the third treating fluid, said steps (a) to (d) being sequentially conducted in the chamber in this order.

The process of the second invention is one of the modifications of the process of the first invention. In the air gap-forming step, the etchant for silicon oxide film is prepared in an etchant preparation apparatus disposed in the vicinity of a treating apparatus having a single-bath chamber, and the etching and cleaning step (a), the first rinsing step (b), the second rinsing step (c) and the drying step (d) are carried out.

Next, the preferred embodiment of the process according to the present invention is explained in detail by referring to the attached drawings. FIG. 1 shows an example of the construction of the treating apparatus used for conducting the process of the invention.

The treating apparatus 10 is a batch apparatus in which micro structural bodies W held in a cassette are subjected to etching, cleaning and drying treatments. As shown in FIG. 1, the treating apparatus 10 has an upper opening 12, a chamber 15 having in its inside a treating chamber 14 for receiving the micro structural bodies W which are introduced through the upper opening 12, a cover 16 for hermetically closing the upper opening 12, a fluid supply source 18 for feeding a treating fluid into the treating chamber 14, a fluid feeding means for introducing the treating fluid from the fluid supply source 18 into the treating chamber 14, an additive feeding means for adding the etchant for silicon oxide film according to the invention to the treating fluid, a fluid discharge means for discharging the treating fluid used for treating the micro structural bodies from the treating chamber 14, and a heating means 20 for heating the treating fluid introduced into the treating chamber 14.

The treating fluid referred to herein means a fluid for removing the silicon oxide film from the micro structural bodies or a supercritical carbon dioxide fluid to be used as a rinsing solution. A fluid made of only a supercritical carbon dioxide fluid, or a supercritical carbon dioxide fluid added with an etchant for silicon oxide film prepared by mixing the fluorine compound, the water-soluble organic solvent and water in given proportions may be also referred to as the treating fluid.

The micro structural bodies W are introduced into or taken out of the treating chamber 14 through the upper opening 12. To ensure the hermetical closing of the upper opening 12 by the cover 16, an O-ring 22 as a sealing member is provided between the periphery of the upper opening 12 of the treating chamber 14 and the cover 16. The cover 16 is fixed to the treating chamber 14 by fastening members 24 such as screws so as to hermetically seal the treating chamber 14. Thus, the inside of the treating chamber 14 is completely sealed by fastening the cover 16 with the fastening members 24 via the O-ring 22. The treating chamber 14 may be provided therein with a holding cassette 26 for receiving and holding the micro structural bodies W.

The fluid feeding means comprises a pressure/temperature control means 27 for controlling the pressure and temperature of the treating fluid, a three-way valve 28, and a fluid feed port 29 formed in the cover 16. From the fluid supply source 18 through the three-way valve 28 and the fluid feed port 29, the treating fluid controlled to desired pressure and temperature by the pressure/temperature control means 27 is fed into the treating chamber 14.

The etchant for silicon oxide film is stored in the additive feeding means. The additive feeding means includes an additive supply source 30 and an additive feed port 31, and is connected to the three-way valve 28. By adjusting the opening of the three-way valve 28, a predetermined amount of the additive is added to the treating fluid through the fluid feed port 29.

The fluid discharge means comprises a fluid discharge port 32 provided in the treating chamber 14, a back pressure valve 34, and an effluent separation apparatus 36 connected to the fluid discharge port 32 through the back pressure valve 34.

The back pressure valve 34 opens when the inner pressure of the treating chamber 14 exceeds the preset pressure to discharge the treating fluid introduced into the treating chamber 14. Thus, the inner pressure of the treating chamber 14 is maintained at the predetermined pressure by the back pressure valve 34.

The effluent separation apparatus 36 is a vapor-liquid separation apparatus which separates the supercritical carbon dioxide fluid (containing the etchant for silicon oxide film or the water-soluble organic solvent) into a gaseous component and a liquid component by reducing the pressure to atmospheric pressure. The gaseous component is the vaporized supercritical carbon dioxide fluid and recovered as an exhaust gas by a gas recovery apparatus (not shown). The liquid components are the separated etchant for silicon oxide film, water-soluble organic solvent, etc. and recovered as an effluent liquid. The recovered exhaust gases are carbon dioxide, etc., and may be reused. The recovered effluent liquid may be also reused.

Further, on a side wall 15a of the chamber 15, provided is a heating means 20 for heating the treating fluid introduced into the treating chamber 14 to maintain the fluid at the predetermined temperature. The heating means 20 is made of a heating medium such as a heating wire and equipped with a temperature control device 38 for controlling the electric power supplied to the heating wire from an electric power source (not shown) provided outside the treating apparatus 14 so as to adjust the temperature of the heating means 20 to a predetermined temperature.

The treating apparatus 10 described above is a treating apparatus for treating the micro structural bodies W in batchwise manner. A single treating apparatus has the construction and process flow basically similar to those of the batch treating apparatus 10 and the treating chamber can be reduced in its size, but the throughput thereof is low.

The process of the second invention may be suitably carried out using the above treating apparatus. In addition, the silicon oxide film, treating fluid, etchant for silicon oxide film, water-soluble organic solvent usable in the process of the second invention are the same as those described with respect to the process of the first invention.

The process of the fourth invention is directed to a process for producing a structural body having a micro structural body from which an etchable layer is removed, which comprises:

an etching step of removing the etchable layer from the micro structural body by etching; and a subsequent cleaning step of contacting the resultant micro structural body with a treating fluid for cleaning, wherein said treating fluid is a supercritical carbon dioxide fluid containing a fluorine compound, a water-soluble organic solvent and water.

The process of the fourth invention preferably includes, subsequent to the cleaning step, a first rinsing step of feeding a supercritical carbon dioxide fluid containing only a water-soluble organic solvent as a second treating fluid, a second rinsing step of feeding only the supercritical carbon dioxide fluid as a third treating fluid, and a drying step of drying the structural body by gasifying the supercritical carbon dioxide fluid fed as the third treating fluid.

The process of the fifth invention is directed to a process for producing a structural body having a micro structural body from which an etchable layer is removed, which comprises the steps of:

(e) removing the etchable layer from the micro structural body by etching;

(f) feeding a first treating fluid prepared by adding a fluorine compound, a water-soluble organic solvent and water to a supercritical carbon dioxide fluid into a single-bath chamber of a treating apparatus containing the micro structural body, thereby cleaning the micro structural body;

(g) feeding a supercritical carbon dioxide fluid containing only a water-soluble organic solvent into the chamber as a second treating fluid, thereby rinsing the micro structural body while replacing the first treating fluid with the second treating fluid;

(h) feeding only a supercritical carbon dioxide fluid to the chamber as a third treating fluid, thereby rinsing the micro structural body while replacing the second treating fluid with the third treating fluid; and (i) drying the micro structural body by gasifying and removing the supercritical carbon dioxide fluid fed as the third treating fluid, said steps (e) to (i) being sequentially conducted within the chamber in this order.

The processes of the fourth and fifth inventions are applicable to the production of a structural body having no movable element, for example, a mask for electron beam exposure lithography, and can be carried out by using the treating apparatus described above in similar operations. The silicon oxide film, treating fluid, etchant for silicon oxide film, water-soluble organic solvent, etc., usable in these processes are the same as those described with respect to the process of the first invention.

The etchant for silicon oxide film according to each of the third, sixth and seventh inventions may be generally used for etching the silicon oxide film, and particularly, applicable to the treating fluid for use in the manufacture of the structural body having a structural layer serving as a micro movable element on a substrate through air gap, which is produced through a film-deposition step of successively forming a sacrificial layer made of a silicon oxide film and the structural layer on the substrate and a subsequent air gap-forming step of removing the sacrificial layer by etching with a specific treating fluid to form the air gap between the substrate and the structural layer, or applicable to a cleaning fluid for use in the manufacture of the structural body having no movable element such as an electron beam exposure mask.

The present invention is described in more detail with reference to the following examples.

EXAMPLE 1

Figure 2A:
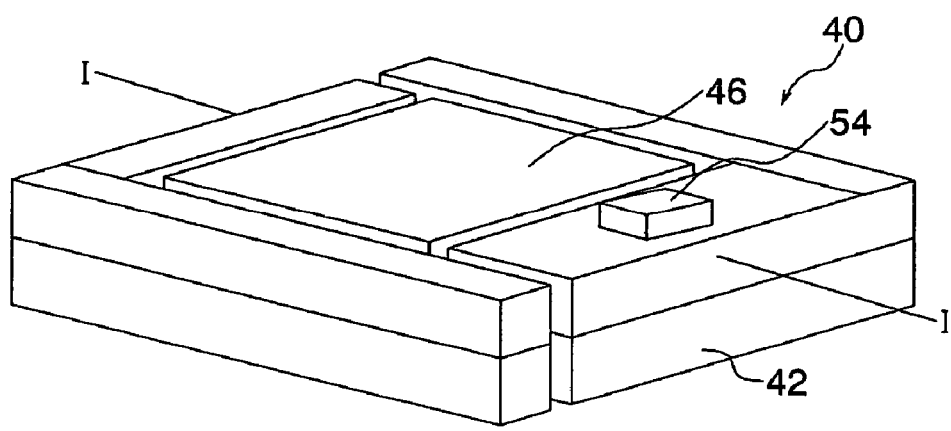
FIG. 2a is a perspective view showing the construction of a diaphragm structural body.
Figure 2B:
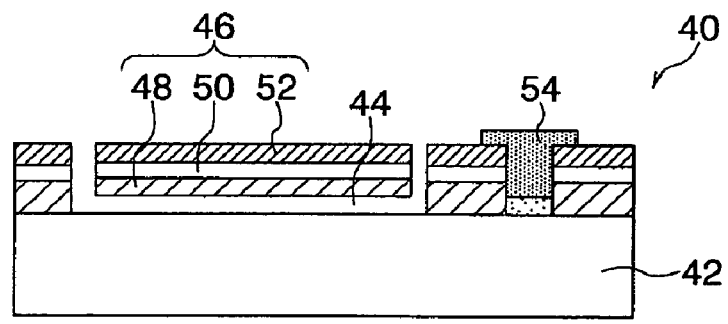
Figure 3A:
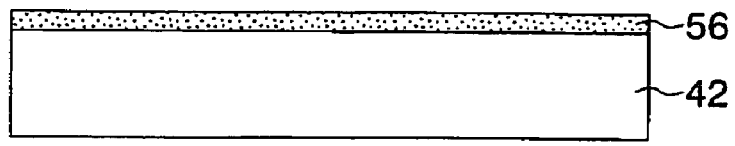
Figure 3B:
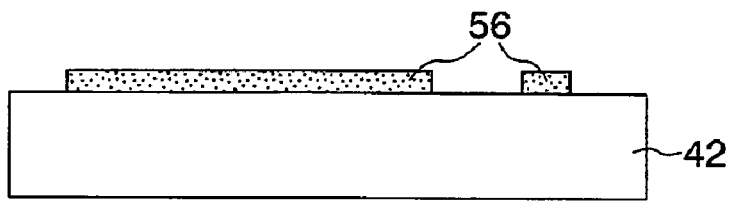
Figure 3C:
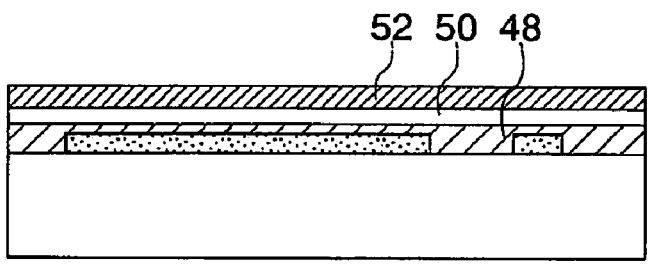
Figure 3D:
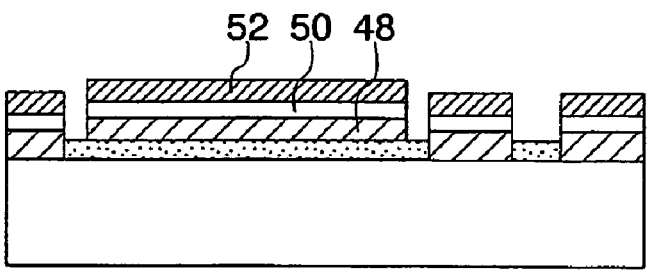
Figure 4E:
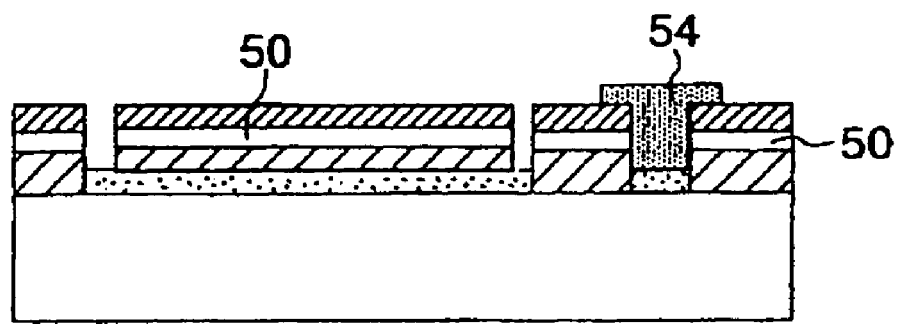
Figure 4F:
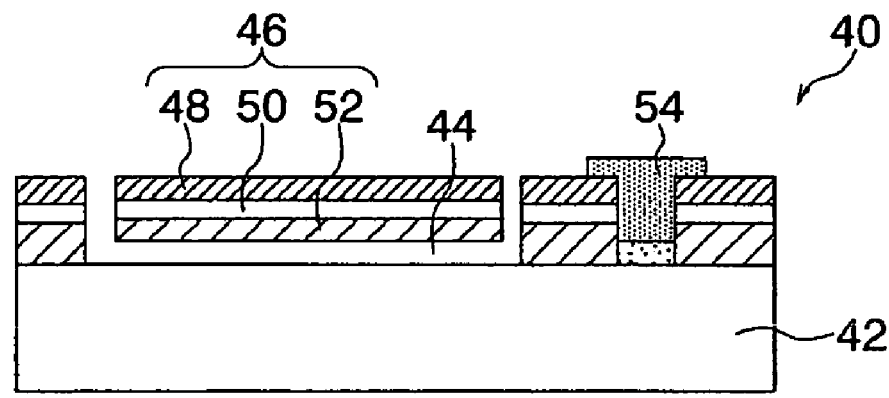
Figure 5A:
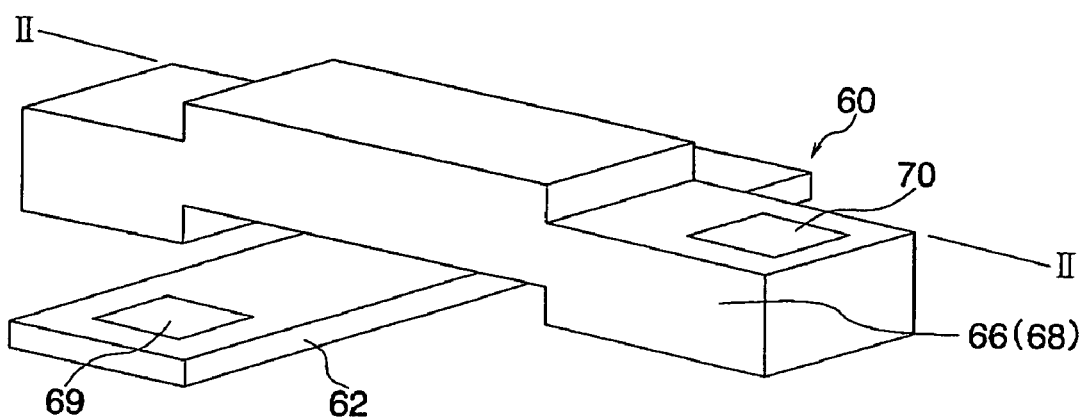
FIG. 5a is a perspective view showing the construction of a beam structural body.
Figure 5B:
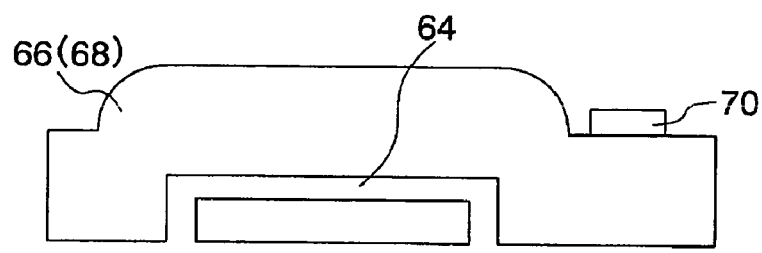
Figure 6A:
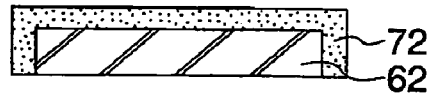
Figure 6B:
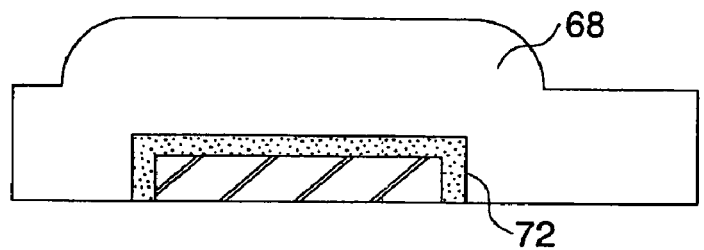
Figure 6C:
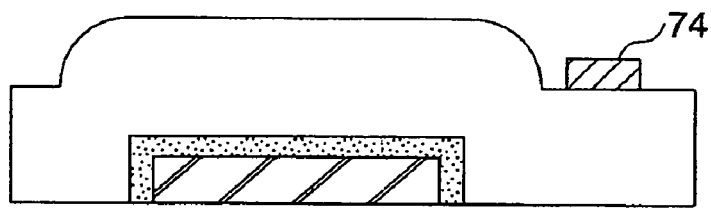
Figure 6D:
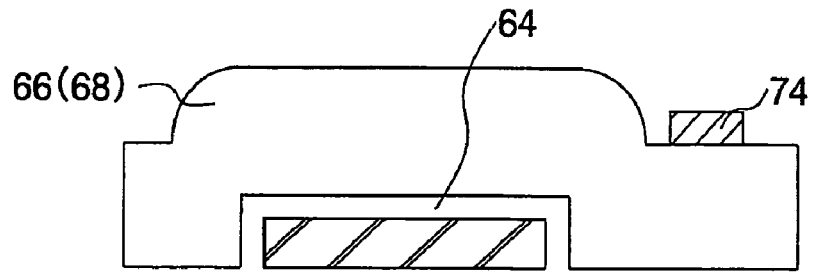
Figure 7A:
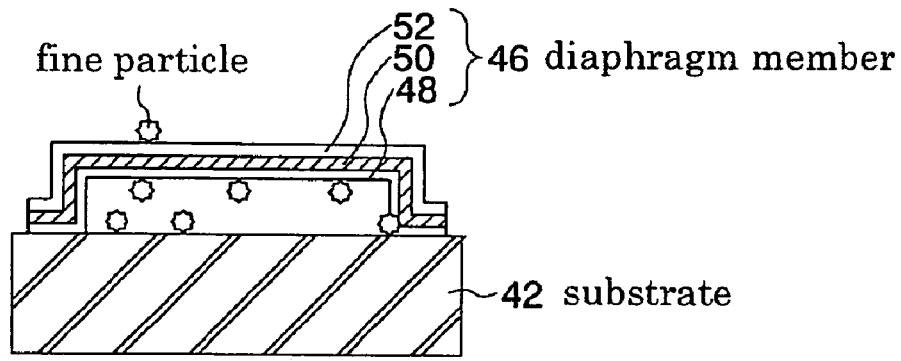
FIGS. 7a to 7c are cross-sectional views of fine particles which are attached onto a diaphragm structural body, electron beam exposure mask and porous low-dielectric constant film provided with trenches and vias for wiring.
Figure 7B:
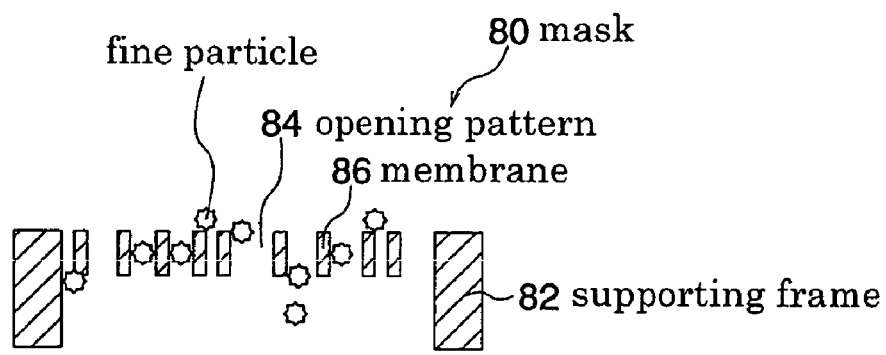
Figure 7C:
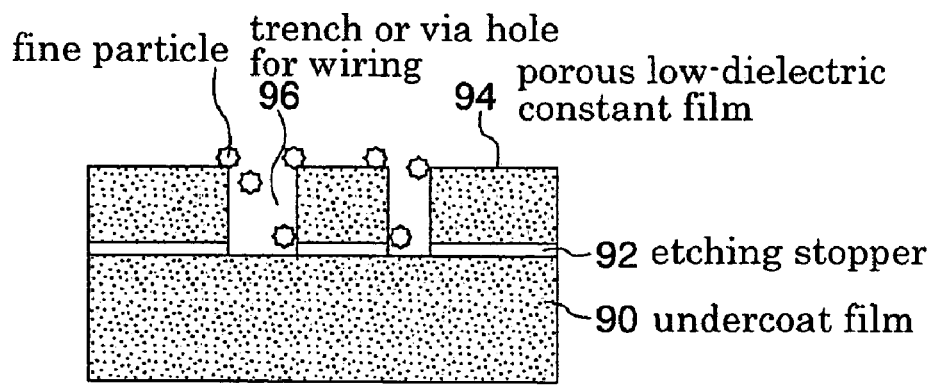

In this Example, using the above treating apparatus 10 and a supercritical carbon dioxide fluid added with an etchant for silicon oxide film as a treating fluid, the micro structural body W, for example, the diaphragm structural body 40 as shown in FIG. 2 having the diaphragm structure 46 was produced by etching the sacrificial layer made of a 500 nm-thick silicon oxide film.

The treating fluid may be prepared by individually adding the fluorine compound, the water-soluble organic solvent and water directly to the supercritical carbon dioxide fluid and mixing. However, in view of easy control of the addition amounts and the easiness of mixing and handling, the treating fluid is prepared preferably by mixing a supercritical carbon dioxide fluid with an etchant for silicon oxide film which is prepared in advance by mixing the fluorine compound, the water-soluble organic solvent and water in predetermined concentrations.

The content of each ingredient of the etchant for silicon oxide film was controlled to 0.5 to 10% by weight for the fluorine compound, 80 to 99% by weight for the water-soluble organic solvent and 0.5 to 10% by weight for water each based on the total weight of these ingredients.

Hydrogen fluoride was used as the fluorine compound. The water-soluble organic solvent was selected from the esters, ethers, ketones, acetonitrile and sulfolane as recited above. In case of using such a water-soluble organic solvent, to promote the etching of the silicon oxide film, the total amount of the water-soluble organic solvent such as esters to be added is controlled preferably to 1 to 20% by volume of the volume of the supercritical carbon dioxide fluid containing the fluorine compound, the water-soluble organic solvent and water. For example, the sacrificial layer made of a 500 nm-thick silicon oxide film was removed in 10 min by etching the micro structural body with a treating fluid which was prepared by adding 10% by volume of an etchant for silicon oxide film composed of 5% by weight of the hydrogen fluoride, 5% by weight of water and 90% by weight of the above water-soluble organic solvent to a supercritical carbon dioxide fluid of 35° C. and 10 MPa.

The alcohols, glycols and glycol esters may be used as a component of the etchant of the invention because of their ability of compatibilizing the fluorine compound or water with the supercritical carbon dioxide fluid. In case of using such compounds, to promote the etching of the silicon oxide film, the total amount of the water-soluble organic solvent such as alcohols to be added is controlled preferably to 1 to 10% by volume of the volume of the supercritical carbon dioxide fluid containing the fluorine compound, the water-soluble organic solvent and water. For example, in case of using a water-soluble alcohol such as methanol, ethanol and 2-propanol as the water-soluble organic solvent and treating the micro structural body for 30 min with a treating fluid prepared by mixing a supercritical carbon dioxide fluid of 35°

C. and 10 MPa with an etchant composed of 5% by weight of hydrogen fluoride, 5% by weight of water and 90% by weight of an alcohol, a silicon oxide film was etched by 180 nm when the addition amount of the water-soluble alcohol was 15% by volume, whereas etched by 500 nm when the addition amount of the water-soluble alcohol was 5% by volume.

First, the holding cassette 26 holding the intermediate products for the diaphragm structural body 40 was placed in the treating chamber 14 through the upper opening 12. Then, the treating chamber 14 was hermetically sealed by the cover 16 and a supercritical carbon dioxide fluid was introduced from the fluid supply source 18 into the treating chamber 14.

Since carbon dioxide changes into a supercritical state when pressurized to 7.38 MPa or higher and heated to 31.1° C. or higher, the supercritical carbon dioxide fluid was introduced from the fluid supply source 18 into the treating chamber 14 through the fluid feed port 29 by controlling the pressure at 7.38 MPa or higher and the temperature at 31.1° C. or higher by the pressure/temperature control means 27.

While introducing the supercritical carbon dioxide fluid, the three-way valve 28 was opened by controlling the opening degree, and the etchant for silicon oxide film was added to the supercritical carbon dioxide fluid at predetermined ratio from the additive supply source 30 through the additive feed port 31.

The supercritical carbon dioxide fluid introduced into the treating chamber 14 was heated by the heating means 20 to maintain its temperature at 31.1° C. or higher. Then, the intermediate products for the diaphragm structural body 40 were brought into contact with the supercritical carbon dioxide fluid added with the etchant for silicon oxide film for a predetermined period of time to remove the silicon oxide film, thereby obtaining a final product of diaphragm structural body 40.

The temperature of the supercritical carbon dioxide fluid was controlled by the temperature control device 38. When the inner pressure of the treating chamber 14 was raised to a predetermined pressure or higher, the back pressure valve 34 was opened so that the supercritical carbon dioxide fluid together and the etchant for silicon oxide film were discharged out of the system through the effluent separation apparatus 36. Thus, the inner pressure and temperature of the treating chamber 14 was kept constant by properly discharging the supercritical carbon dioxide fluid introduced into the treating chamber 14.

After removing the silicon oxide film by immersing the intermediate products of diaphragm structural body 40 in the supercritical carbon dioxide fluid added with the etchant for silicon oxide film for a predetermined period of time, a rinsing liquid consisting of a supercritical carbon dioxide fluid and a water-soluble organic solvent was fed into the treating chamber 14 and the etchant for silicon oxide film was discharged so as to gradually reduce its concentration, while keeping the intermediate products of diaphragm structural body 40 immersed in the supercritical carbon dioxide fluid added with the etchant for silicon oxide film. Then, a rinsing liquid consisting of a supercritical carbon dioxide fluid was fed into the treating chamber 14 while discharging the water-soluble organic solvent so as to gradually reduce its concentration. The waste liquid mixture of carbon dioxide and the additive was separated and recovered for reuse.

Thereafter, by reducing the inner pressure of the treating chamber 14 to discharge carbon dioxide and cooling the treating chamber 14, the diaphragm structural bodies 40 was allowed to be surrounded by carbon dioxide gas for drying. In such a supercritical drying using the supercritical carbon dioxide fluid, after the cleaning under the conditions kept at 31.1° C. or higher and 7.38 MPa or higher, the pressure was reduced to atmospheric pressure while maintaining the temperature at 31.1° C. or higher, and then, the temperature was lowered from 31.1° C. or higher to room temperature, e.g., 20° C. With such a procedure, the diaphragm structural bodies 40 in the treating chamber 14 were dried. In this manner, by changing the phase from the supercritical state to the gaseous state, the diaphragm structural bodies 40 were dried without rapture.

In this example, the 500 nm-thick silicon oxide film was completely removed by etching in 10 min.

Although the production of the diaphragm structural body 40 is taken as an example in Example 1, the above process is also applicable to removal of the silicon oxide film from the beam structural body 60.

EXAMPLE 2

In this example, by setting and controlling the addition amount of the etchant for silicon oxide film at a small level to reduce the etching rate, the processes according to the second and fifth inventions were applied to the cleaning of the micro structural body, for example, the cleaning of the electron beam exposure mask 80 and the trench or via for wiring formed on the porous low-dielectric constant film 94.

EXAMPLE 3

The etchant for silicon oxide film in this example was a mixture comprising 0.5 to 10% by weight of the fluorine compound, for example, 5% by weight of hydrogen fluoride, 80 to 99% by weight of the water-soluble organic solvent, for example, 90% by weight of at lease one compound selected from the esters, ethers, ketones, acetonitrile and sulfolane as describe above, and 0.5 to 10% by weight of water, for example, 5% by weight of water, and was used for etching the silicon oxide film after added into a supercritical carbon dioxide fluid.

By adding into a supercritical carbon dioxide fluid in an amount of 1 to 10% by volume, the etchant for silicon oxide film in this example was made into a treating fluid for use, as in Example 1, in the removal by etching of the silicon oxide film formed as the sacrificial layer of the intermediate product of the diaphragm structural body 40.

For example, by treating the intermediate product of the diaphragm structural body 40 with a treating fluid prepared by adding 10% by volume of the etchant for silicon oxide film to the supercritical carbon dioxide fluid of 35° C. and 10 MPa, the sacrificial layer made of a 500 nm-thick silicon oxide film was removed in 10 min.

If the content of hydrogen fluoride in the etchant for silicon oxide film exceeds 10% by weight, the treating fluid is likely to be separated into two or more phases to cause the deposition of contaminants on the diaphragm structural body 40 or the rapture of its structure.

EXAMPLE 4

This example relates to another example of the etchant for silicon oxide film, which was a mixture comprising 5% by weight of hydrogen fluoride, 80 to 99% by weight of the water-soluble organic solvent, for example, 90% by weight of at lease one compound selected from the alcohols, glycols, glycol ethers and γ-butyrolatone as described above, and 5% by weight of water, and was used for etching the silicon oxide film after added into a supercritical carbon dioxide fluid.

By adding into a supercritical carbon dioxide fluid in an amount of 1 to 10% by volume, the etchant for silicon oxide film in this example was made into a treating fluid for use, as in Example 1, in the removal by etching of the silicon oxide film formed as the sacrificial layer of the intermediate product of the diaphragm structural body 40.

For example, by treating the intermediate product of the diaphragm structural body 40 for 30 min with a treating fluid prepared by adding 15% by volume of the etchant for silicon oxide film to the supercritical carbon dioxide fluid of 35° C. and 10 MPa, the silicon oxide film was etched by 180 nm, whereas etched by 500 nm when the addition amount was 5% by volume.

The process and etchant for silicon oxide film according to the present invention are applicable to the production of any structural bodies without particular limitations as long as the structural bodies have a structural layer serving as a micro movable element on a substrate through an air gap. Particularly, the process and etchant of the present invention are applicable to the production of micro structural bodies such as micro driving bodies called MEMS used as parts of various sensors, etc., for example, diaphragm members and beam members as well as structural bodies having a microstructure such as semiconductor pressure sensors, infrared sensors, accelerator sensors, printer nozzles and frequency filters. In addition, the process and etchant of the present invention are also applicable to the production of structural bodies having no movable element, for example, the production of semiconductor substrates having fine LSI patterns, the production of electron beam exposure masks for forming fine patterns, the formation of trenches or vias for wiring on low-dielectric constant films, etc.

What is claimed is:

1. A process for producing a structural body comprising a substrate and a structural layer formed on the substrate through an air gap which structural layer functions as a micro movable element, said process comprising:
a film-deposition step of successively forming a sacrificial layer made of a silicon oxide film and the structural layer on the substrate; and
an air gap-forming step of removing the sacrificial layer by etching with a treating fluid to form the air gap between the substrate and the structural layer, followed by a cleaning treatment,
wherein said treating fluid used in the air gap-forming step is a supercritical carbon dioxide fluid containing hydrogen fluoride, a water-soluble organic solvent and water.

2. The process according to claim 1, further comprising, subsequent to the air gap-forming step, a drying step of drying the structural body by gasifying the supercritical carbon dioxide fluid.

3. The process according to claim 1, further comprising, subsequent to the air gap-forming step, a first rinsing step of feeding the supercritical carbon dioxide fluid containing only the water-soluble organic solvent as a second treating fluid, a second rinsing step of feeding only the supercritical carbon dioxide fluid as a third treating fluid, and a drying step of drying the structural body by gasifying the supercritical carbon dioxide fluid fed as the third treating fluid.

4. A process for producing a structural body comprising a substrate and a structural layer formed on the substrate through an air gap which structural layer functions as a micro movable element, said process comprising:
a film-deposition step of successively forming a sacrificial layer made of a silicon oxide film and the structural layer on the substrate to form a laminate; and
a subsequent air gap-forming step comprising the steps of:
(a) feeding a first treating fluid prepared by adding hydrogen fluoride, a water-soluble organic solvent and water to a supercritical carbon dioxide fluid into a single-bath chamber of a treating apparatus containing the laminate, thereby etching the sacrificial layer of the laminate and cleaning the laminate;
(b) feeding the supercritical carbon dioxide fluid containing only the water-soluble organic solvent into the chamber as a second treating fluid, thereby rinsing the laminate while replacing the first treating fluid with the second treating fluid;
(c) feeding only the supercritical carbon dioxide fluid to the chamber as a third treating fluid, thereby rinsing the laminate while replacing the second treating fluid with the third treating fluid; and
(d) drying the laminate by gasifying and removing the supercritical carbon dioxide fluid fed as the third treating fluid,
said steps (a) to (d) being sequentially conducted in the chamber in this order.

5. The process according to claim 1, wherein the silicon oxide film formed as the sacrificial layer in the film-deposition step is a thermal oxidation film, a native oxide film, a vacuum CVD oxide film or a plasma CVD oxide film each produced from tetraethoxysilane as a film-deposition raw material, a spin-on-glass coating oxide film produced from an organosilicon oxide as a film-deposition raw material, or a spin-on-glass coating oxide film produced from a film-deposition raw material other than the organosilicon oxide.

6. The process according to claim 1, wherein the supercritical carbon dioxide fluid used as the treating fluid in the air gap-forming step contains a mixture comprising 0.5 to 10% by weight of the hydrogen fluoride, 80 to 99% by weight of the water-soluble organic solvent, and 0.5 to 10% by weight of water.

7. The process according to claim 1, wherein the supercritical carbon dioxide fluid used as the treating fluid in the air gap-forming step contains at least one compound selected from the group consisting of alcohols, glycols, glycol ethers and γ-butyrolactone as the water-soluble organic solvent in an amount of 1 to 10% by volume.

8. The process according to claim 1, wherein the supercritical carbon dioxide fluid used as the treating fluid in the air gap-forming step contains at least one compound selected from the group consisting of esters, ethers, ketones, acetonitrile and sulfolane as the water-soluble organic solvent in an amount of 1 to 20% by volume.

9. The process according to claim 1, wherein the treating fluid used in the air gap-forming step is the supercritical carbon dioxide fluid added with an etchant for silicon oxide film comprising a mixture of hydrogen fluoride, the water-soluble organic solvent and water.

10. The process according to claim 1, wherein said water-soluble organic solvent serves as a dissociation agent for the hydrogen fluoride.

11. The process according to claim 4, wherein said water-soluble organic solvent serves as a dissociation agent for the hydrogen fluoride.

12. The process according to claim 1, wherein in the air gap-forming step said silicon oxide film is etched by said treating fluid.

13. The process according to claim 4, wherein in said feeding said first treating fluid, said silicon oxide film of said sacrificial layer is etched.

* * * * *